(12) United States Patent
Birnstock et al.

(10) Patent No.: US 8,022,619 B2
(45) Date of Patent: Sep. 20, 2011

(54) TOP-EMITTING, ELECTROLUMINESCENT COMPONENT WITH AT LEAST ONE ORGANIC LAYER

(75) Inventors: Jan Birnstock, Dresden (DE); Martin Vehse, Dresden (DE); Tilmann Romainczk, Dresden (DE)

(73) Assignee: Novaled AG, Dresden (DE)

( * ) Notice: Subject to any disclaimer, the term of this patent is extended or adjusted under 35 U.S.C. 154(b) by 381 days.

(21) Appl. No.: 11/572,458

(22) PCT Filed: Jul. 12, 2005

(86) PCT No.: PCT/DE2005/001229
§ 371 (c)(1),
(2), (4) Date: Jun. 29, 2007

(87) PCT Pub. No.: WO2006/010355
PCT Pub. Date: Feb. 2, 2006

(65) Prior Publication Data
US 2008/0048557 A1      Feb. 28, 2008

(30) Foreign Application Priority Data
Jul. 23, 2004   (DE) .................. 10 2004 035 965

(51) Int. Cl.
*H01J 1/54*         (2006.01)
*H01J 1/53*         (2006.01)
(52) U.S. Cl. ................. 313/506; 313/498; 313/504
(58) Field of Classification Search ........... 313/498–512
See application file for complete search history.

(56) References Cited
U.S. PATENT DOCUMENTS
6,356,032 B1    3/2002   Suzuki et al.
(Continued)

FOREIGN PATENT DOCUMENTS
DE         101 64 016         7/2003
(Continued)

OTHER PUBLICATIONS

I. Schnitzer, 30% External Quantum Efficiency from Surface Textured, Thin-film Light-Emitting Diodes, Appl. Phys. Lett., vol. 63, pp. 2174-2176, Oct. 1993.

(Continued)

*Primary Examiner* — Joseph L Williams
*Assistant Examiner* — Nathaniel Lee
(74) *Attorney, Agent, or Firm* — Sutherland, Asbill & Brennan, LLP

(57) ABSTRACT

In order to improve the decoupling efficiency in a top-emitting OLED a top-emitting electroluminescent component (100) is suggested comprising a substrate, a first electrode (120) nearest to the substrate, a second electrode (14) located at a distance from the substrate, and at least one light-emitting organic layer (130) arranged between both electrodes, the emitted light being transmitted through the second electrode. The component in accordance with the invention is distinguished by an additional layer (150) facing away from the at least one organic layer is arranged on the side of the second electrode, which additional layer comprises optically effective light-emitting heterogeneities (151, 152, 153), especially in the form of scatter centers, the degree of transmission of the additional layer of the emitted light being greater than 0.6. This additional layer can be applied by various wet-chemical processes and vacuum methods, the inhomogeneities being introduced into and/or applied onto the decoupling additional layer during or after the application process. Furthermore, the invention also relates to a method for producing such a component.

33 Claims, 6 Drawing Sheets

U.S. PATENT DOCUMENTS

Figure 1:
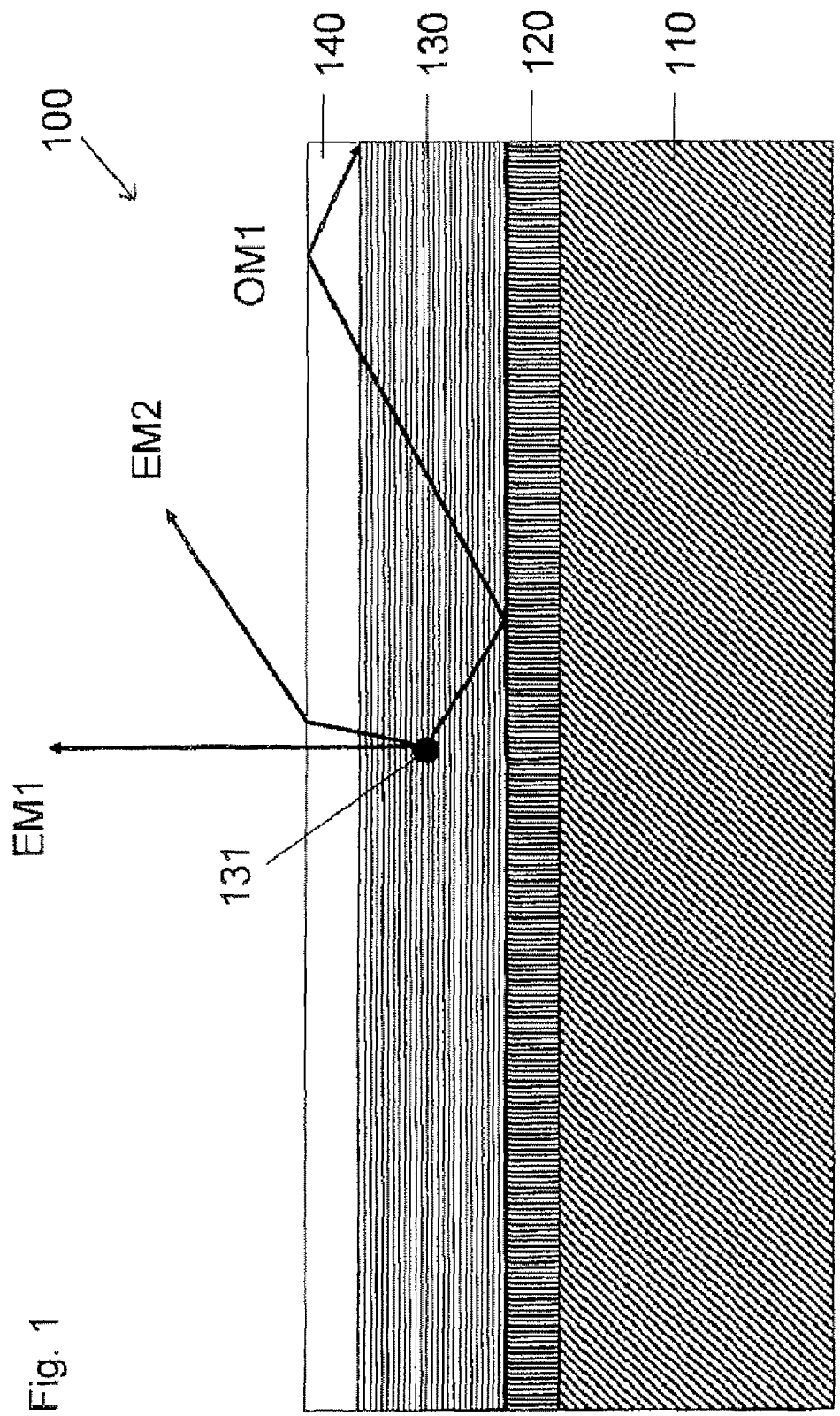

| | | |
|---|---|---|
| 6,514,674 B1 | 2/2003 | Iwasaki et al. |
| 6,566,807 B1 | 5/2003 | Fujita et al. |
| 6,965,197 B2 | 11/2005 | Tyan et al. |
| 7,012,363 B2 | 3/2006 | Weaver et al. |
| 7,141,817 B2 | 11/2006 | Nishi et al. |
| 7,256,541 B2 | 8/2007 | Birnstock et al. |
| 2001/0026124 A1* | 10/2001 | Liu et al. ............... 313/504 |
| 2001/0033135 A1* | 10/2001 | Duggal et al. ........... 313/506 |
| 2001/0035713 A1* | 11/2001 | Kimura ................... 313/501 |
| 2001/0055841 A1 | 12/2001 | Yamazaki et al. |
| 2002/0015807 A1 | 2/2002 | Sugino et al. |
| 2002/0033129 A1* | 3/2002 | Liu et al. ................... 117/5 |
| 2002/0084993 A1 | 7/2002 | Teneya |
| 2002/0180372 A1 | 12/2002 | Yamazaki et al. |
| 2003/0111666 A1 | 6/2003 | Nishi et al. |
| 2003/0127973 A1 | 7/2003 | Weaver et al. |
| 2003/0146443 A1 | 8/2003 | Yamazaki et al. |
| 2004/0021434 A1 | 2/2004 | Yoneda et al. |
| 2004/0066824 A1 | 4/2004 | Magno |
| 2004/0089869 A1* | 5/2004 | Uemura ..................... 257/85 |
| 2004/0109328 A1* | 6/2004 | Dahl et al. ............... 362/555 |
| 2004/0183963 A1 | 9/2004 | Nakamura et al. |
| 2004/0241493 A1* | 12/2004 | Inoue et al. ............. 428/690 |
| 2005/0007000 A1 | 1/2005 | Chou et al. |
| 2005/0118745 A1 | 6/2005 | Yamazaki et al. |
| 2005/0122035 A1* | 6/2005 | Birnstock et al. ........ 313/504 |
| 2005/0142379 A1 | 6/2005 | Juni et al. |
| 2006/0033115 A1 | 2/2006 | Blochwitz et al. |
| 2006/0175960 A1 | 8/2006 | Noh et al. |
| 2007/0013291 A1* | 1/2007 | Cok et al. ................ 313/501 |
| 2007/0035236 A1 | 2/2007 | Murano et al. |

FOREIGN PATENT DOCUMENTS

| | | |
|---|---|---|
| DE | 10164016 A1 * | 7/2003 |
| DE | 10215210 | 10/2003 |
| EP | 1406474 | 4/2004 |
| EP | 1434283 | 6/2004 |
| EP | 1548856 | 6/2005 |
| GB | 2001/2361356 | 10/2001 |
| GB | 2003/2390215 | 12/2003 |
| WO | 0076008 | 12/2000 |
| WO | 0237580 | 5/2002 |
| WO | WO02/37580 | 5/2002 |
| WO | 03061028 | 7/2003 |
| WO | 2004/086462 | 10/2004 |

OTHER PUBLICATIONS

C.F. Madigan, Improvement of Output Coupling Efficiency of Organic Light-Emitting Diodes by Backside Substrate Modification, Appl. Phys. Lett., vol. 76, pp. 1650-1652, Mar. 2000.

T. Yamasaki et al., Organic Light Emitting Device with an Ordered Monolayer of Silica Microspheres as a Scattering Medium, Appl. Phys. Lett., vol. 76, pp. 1243-1245, Mar. 2000.

J.M. Lupton et al., Bragg Scattering from Periodically Microstructured Light Emitting Diodes, Appl. Phys. Lett., vol. 77, pp. 3340-3342, Nov. 200.

S.A. Carter et al., Enhanced Luminance in Polymer Composite Light Emitting Devices, Appl. Phys. Lett., vol. 71, pp. 1145-1147, Sep. 1997.

Pfeiffer M, et al, Doped Organic Semiconductors: Physics and Application in Light Emitting Diodes, Organic Electronics, vol. 4., No. 2/3, pp. 89-103. Sep. 2003.

Notice of Allowance, U.S. Appl. No. 11/463,697 (May 13, 2009).

Non-Final Office Action, U.S. Appl. No. 11/463,697 (Dec. 15, 2008).

Search Report for EP 1753048; Feb. 2, 2006.

International Search Report for PCT/EP2007/000208, Apr. 10, 2007.

Disclosure under 37 CFR 1.56 for U.S. Appl. No. 11/572,458; Submitted Herewith.

Response to Office Action, U.S. Appl. No. 11/463,697 (Apr. 15, 2009).

Office Action of the Japanese Patent Office for JP 2007-521783, Jan. 26, 2010 (original document and an English translation attached).

* cited by examiner

TOP-EMITTING, ELECTROLUMINESCENT COMPONENT WITH AT LEAST ONE ORGANIC LAYER

CROSS-REFERENCE TO RELATED APPLICATION

This is a submission pursuant to 35 U.S.C. 154(d)(4) to enter the national stage under 35 U.S.C. 371 for PCT/DE2005/001229, filed Jul. 12, 2005. Priority is claimed under 35 U.S.C. 119(a) and 35 U.S.C. 365(b) to German Patent Application No. 10 2004 035 965.2 filed Jul. 23, 2004. The subject matters of PCT/DE2005/001229 and German Patent Application No. 10 2004 035 965.2 are hereby expressly incorporated herein by reference.

The invention relates to a top-emitting, electroluminescent component in accordance with the preamble of claim 1 as well as to a method for its manufacture in accordance with the preamble of claim 20.

BACKGROUND OF THE INVENTION

In recent years a great requirement for smaller and smaller space-saving, light and economical display modules and displays for the rapid and adequate visualization of data has developed. Currently, LCDs (Liquid Crystal Displays) predominate in the area of flat screens for notebooks, mobile telephones and digital camera. However, they have a few disadvantages such as the strong angular dependency of contrast and colors, slow reaction times for image and contrast change and a low efficiency conditioned by a plurality of filters and polarizers, so that in order to achieve the required luminosity relatively high energies must be used. To this extent the demand for small, high-resolution, colored and current-saving screens with improved display qualities is great. Displays on the basis of organic light emitting diodes (OLEDs) represent an alternative to LCDs since they consist themselves of light-emitting pixels and therefore have no background illumination. They can be produced flexibly and thin with low production costs, e.g., in the form of a foil, and be operated with a relatively low expenditure of energy. Given their low operating voltage, the high energy efficiency as well as the possibility of manufacturing areally emitting components for the emission of any colors, OLEDs are also suitable for use in illuminating elements.

OLEDs are based on the principle of electroluminescence in which electron-hole pairs, so-called excitons, recombine under the emission of light. To this end the OLED is constructed in the form of a sandwich structure wherein at least one organic film is arranged as active material between two electrodes, positive and negative charge carriers are injected into the organic material and a charge transport takes place from holes or electrons to a recombination zone in the organic layer where a recombination of the charge carrier to singlet and/or triplet excitons occurs under the emission of light. The subsequent radiant recombination of excitons causes the emission of the visible useful light emitting by the light-emitting diode. In order that this light can leave the component at least one of the electrodes must be transparent. As a rule this transparent electrode consists of conductive oxides designated as TCOs (transparent conductive oxides). The starting point in the manufacture of an OLED is a substrate on which the individual layers of the OLED are applied. If the electrode nearest to the substrate is transparent the component is designated as a "bottom-emission OLED" and if the other electrode is designed to be transparent the component is designated as a "top-emission OLED". The same applies to the case of completely transparent OLEDs, in which the electrode between the substrate and the at least one organic layer as well as the electrode at a distance from the substrate are designed to be transparent.

As explained, the generation of light in the active zone or emission zone of the component by radiant recombination of electrons and defect electrons (holes) takes place via excitonic states. The different layers of OLEDs, e.g., the transparent electrodes and the at least one organic layer have in general a different refractive index that is by nature greater than 1. To this extent not all generated photons can leave the component and be perceived as light since total reflections can occur on the different boundary surfaces within the component or between the component and the air. Furthermore, even a part of the generated light is reabsorbed within the component. Depending on the configuration of the OLEDs, a formation of optical substrate- and/or organic modes (that is, diffusion of light in the substrate, the transparent electrode and/or the at least one organic layer) takes place in addition to the diffusion of external modes based on the previously described total reflection. If the electrode nearest to the substrate is not transparent (top-emission OLED), in addition to external modes only modes in the at least one organic layer and/or the electrode at a distance from the substrate can diffuse that are designated in common as organic modes. Only the external optical modes can be perceived as light by the observer, whose proportion of the entire luminescence generated within the component is less than 20%, as a function of the configuration of the OLED. To this extent there is a need to decouple these internal optical modes, that is, organic-and optionally substrate modes more strongly from the component in order to achieve the highest possible degree of efficiency of the organic light-emitting component.

In order to improve the decoupling efficiency a plurality of methods and designs, in particular for bottom-emitting OLEDs, are known that concern the decoupling of optical substrate modes. To this end the article "30% external quantum efficiency from surface textured, thin-film light-emitting diodes" by I. Schnitzer, Appl. Phys. Lett., vol. 63, page 2174 (1993) suggests roughening the surface of the substrate, which avoids to a considerable extent the occurrence of total reflection on the boundary surface between substrate and air. This roughening can be achieved, e.g., by etching or sand-blasting the substrate surface facing away from the organic. In the contribution "Improvement of output coupling efficiency of organic light-emitting diodes by backside substrate modification" by C. F. Madigan, Appl. Phys. Lett., vol. 76, page 1650 (2000) the application of a spherical pattern on the back side of the substrate surface is described. This pattern can comprise, e.g., an array of lenses that is applied onto the substrate by pasting or laminating. The article "Organic light emitting device with an ordered monolayer of silica microspheres as a scattering medium" by T. Yamasaki et al., Appl. Phys. Lett., volume 76, page 1243 (2000) suggests applying microspheres of quartz glass onto the surface of the substrate in order to improve the decoupling of the light in an OLED. These microspheres can also be arranged adjacent to the OLED. Furthermore, it is also known that periodic structures with a period length in a range of the wavelength of the light emitted by the OLED can be generated between the substrate and the first electrode, the periodic structure being propagated into the optically effective layer of the light-emitting diode. The indicated geometry finally has a Bragg scattering as a consequence that increases the efficiency of the component, see J. M. Lupton et al., Appl. Phys. Lett., vol. 77, page 3340 (2000). Furthermore, German unexamined publication (Offenlegungsschrift) DE 101 64 016 A1 relates to an organic light-emitting diode in which the at least one organic layer exhibits different partial areas with various refractive indices. As a result of the deflection at the phase boundaries within the organic, fewer photons remain in the layer due to wave conduction losses than in homogenous layers.

Moreover, in addition to this utilization of intrinsic inhomogeneities in the active organic layer it is known that foreign bodies such as nanoparticles can be introduced into the organic electroluminescent material so that wave conductor effects within the organic can be avoided, see, e.g., "Enhanced luminance in polymer composite light emitting devices", by S. A. Carter et al., Appl. Phys. Lett., vol. 71 (1997). These nanoparticles can consist, e.g., of $TiO_2$, $SiO_2$ or $Al_2O_3$ and be embedded in a polymeric emitter material such as MEH-PPV.

In addition to the bottom-emitting OLEDs the top-emitting OLEDs are becoming increasingly relevant since they have advantages over the first-named ones for specific applications. If both electrodes as well as the substrate are transparent a component can be made available that is electroluminescent in its totality, that is, that radiates up and down. If the substrate does not have to be transparent as in the top-emitting OLED, many other substrates can be used in addition to glass that make it possible, e.g., that the component is flexible, that is, bendable. Furthermore, even metal foils, silicon wafers or other substrates with silicon-based electronic components as well as printed circuit boards can serve as substrates in such a top-emitting electroluminescent component.

SUMMARY OF THE INVENTION

It is the object of the invention to improve the decoupling efficiency of the light generated within the at least one organic layer in a generic top-emitting, electroluminescent component. This object is solved in a surprisingly simple manner as concerns the apparatus with a component with the features of claim 1.

The top-emitting electroluminescent component in accordance with the invention that is designed in particular as an organic light-emitting diode device comprises a substrate, a first electrode nearest to the substrate, a second electrode at a distance from the substrate and at least one light-emitting organic layer arranged between both electrodes, the emitted light being transmitted through the second electrode. The component is distinguished in accordance with the invention in that an additional layer that comprises optically acting, light-scattering heterogeneities, in particular in the form of scatter centers, is arranged on the side of the second electrode that faces away from the at least one organic layer, wherein the degree of transmission of the additional layer of the emitted light is greater than 0.6. The degree of transmission $\tau$ of the additional layer is determined in accordance with the appropriate formula $\tau = e^{-(\alpha d)}$, in which $\alpha$ indicates the absorption coefficient and d the thickness of the layer.

The design, in accordance with the invention, of the top-emitting, electroluminescent component can increase its decoupling efficiency up to a factor of 4 as a function of the specific embodiment, which represents a significant improvement. Furthermore, the additional layer can also assume other functions in addition to the indicated function.

The invention is based on the idea of influencing the diffusion of the optical modes within the organic layers and the transparent electrode in such a manner by providing a decoupling layer on the side of the second electrode, that faces away from the organic layer or layers, that the decoupling efficiency is increased. Optically effective heterogeneities that cause a deflection of light in any way are suitable for this. They can bring forth, e.g., scatter effects or also diffraction effects and the active centers can be arranged within the decoupling layer as well as on its boundary surfaces, in particular on the boundary surface facing away from the electrode. Furthermore, the heterogeneities can be of an extrinsic nature as well as also be caused intrinsically by the layer itself. The particular design of the decoupling layer prevents optical modes from being able to develop in the organic layer or layers and/or in the contact layer so that light couples in primarily in external modes. The decoupling layer must be transparent in order to avoid the absorption of too much light within the additional layer. The inventors found that a degree of transmission greater than 0.6 suffices for finally coupling more light out of the component in accordance with the invention.

Advantageous embodiments are indicated in the sub-claims.

The additional layer or decoupling layer can be directly adjacent to the second electrode and be connected to it as a function of the embodiment but it can also be spaced apart from it at least in sections. If the additional layer and the second electrode form a common boundary surface and/or are connected to one another, this results in an especially effective coupling in of the organic modes into the additional layer. However, it can also be purposeful in certain applications if the additional layer is spaced apart from the second electrode at least in sections; however, the interval should be less than approximately the wavelength of the emitted light.

An especially high degree of efficiency for the decoupling can be made available if the optically effective heterogeneities are arranged as scatter particles within the layer, especially homogeneously within the volume of the additional layer, the particles having a size of approximately 0.05 µm to 100 µm. The indicated size of the scatter particles ensures that no wavelength-dependent scatter in the form of Rayleigh scatter occurs whose intensity is proportional to $1/\lambda^4$. If the scatter particles are larger than approximately 100 µm the scatter takes place to a very great extent in the forward direction with increased absorption, which is just as undesirable as the wavelength-dependent scatter. According to the invention the concept "scatter particles" comprises every particle or areas in the additional layer with the indicated expansion between 0.05 µm and 100 µm that substantially have Mie scattering, that is, wavelength-independent properties.

Furthermore, it can, however, also be purposeful if the optically effective heterogeneities are arranged on the surface of the additional layer facing away from the second electrode, the scatter centers having a size of approximately 0.05 µm to 100 µm.

An especially effective decoupling layer can be made available in that the indicated heterogeneities are arranged within the additional layer as well as also on its surface.

The thickness of the second electrode can purposefully be less than 200 nm, especially less than 80 nm, which results in an especially effective coupling in of the light from the organic into the additional layer since the evanescent field is not strongly weakened by the second electrode. It is advantageous here if the refractive index of the additional layer is adjusted to be greater than the refractive index of the nearest organic layer arranged between the electrodes. It is especially advantageous if the thickness of the second electrode is even smaller, especially approximately 40 nm.

In order to avoid a total reflection of light on the boundary surface between the second electrode and the additional layer when the light from the electrode enters into the additional layer it can be provided that the refractive index of the additional layer is greater than the refractive index of the second electrode. It can be purposeful here if the refractive index of the additional layer is between 1.3 and 2.3, especially between 1.6 and 2.0. As a result thereof, the organic modes are completely or to a significant part coupled into the decoupling layer.

It can basically be determined that even top-emitting electroluminescent components can be provided with the decoupling layer in accordance with the invention if it comprises several organic layers. As is indicated in particular in German unexamined publication (Offenlegungsschrift) DE 102 15 210 A1, it can be advantageous if even other organic layers are arranged adjacent to the light-emitting organic layer between the two electrodes. Such a general structure of the component has the following layers in the case of a non-inverted construction:

1. Substrate,
2. First electrode, hole-injecting anode,
3. p-doped, hole-injecting and transporting layer,
4. Thin intermediate layer on the hole side consisting of a material whose energy level of the HOMO (highest occupied molecule orbital) matches the energy levels of the HOMOs of the layers surrounding it,
5. Light-emitting layer,
6. Thin intermediate layer on the electron side consisting of a material whose energy level of the LUMO (lowest unoccupied molecule orbital) matches the energy levels of the LUMOs of the layers surrounding it,
7. n-doped electron-injecting and transporting layer,
8. Second electrode, electron-injecting cathode.

In the case of an inverted construction of the component the following layers result:

1. Substrate,
2. a) First electrode, electron-injecting cathode,
3. a) n-doped electron-injecting and transporting layer,
4. a) Thin intermediate layer on the electron side consisting of a material whose energy level of the LUMO (lowest unoccupied molecule orbital) matches the energy levels of the LUMOs of the layers surrounding it,
5. a) Light-emitting layer,
6. a) Thin intermediate layer on the hole side consisting of a material whose energy level of the HOMO (highest occupied molecule orbital) matches the energy levels of the HOMOs of the layers surrounding it,
7. a) p-doped, hole-injecting and transporting layer,
8. a) Second electrode, electron-injecting anode.

As is indicated in unexamined publication (Offenlegungsschrift) DE 102 15 210 A1 the hole transport layer can be p-doped with an acceptor-type organic material and the electrode transport layer can be doped with a donor-type organic material. This doping has an elevated conductivity as a consequence so that the transport layers can have higher layer thicknesses than is customary in comparison to non-doped layers (typically 20 to 40 nm) without the operating voltage being drastically elevated. In so far it can be purposeful in the case of a non-inverted construction of the component in accordance with the invention if another organic layer is arranged between the additional layer and the active organic layer, which other layer is an electrode transport layer that is n-doped with a donor-type organic material and has a thickness between 50 nm and 2 μm, especially a thickness between 100 nm and 1000 nm. In the case of an inverted construction of the component this other organic layer is a hole transport layer that is p-doped with an acceptor-type organic material and has a thickness between 50 nm and 2 μm, especially a thickness between 100 nm and 1000 nm. It is understood that in accordance with the above-indicated general structure of the component in accordance with the invention another electrode as well as, if need be, a block layer is/are additionally arranged between the additional layer and the active organic layer.

It is pointed out for the sake of completion that depending on the embodiment of the component in accordance with the invention not all previously indicated layer types must be comprised in the inverted or non-inverted configuration; however, furthermore even other layers such as, e.g., a thin (smaller than 10 nm) contact-improving layer can be provided between the electron transport layer and the cathode and/or between the anode and the hole transport layer. It is essential for the following process steps, especially for the application of the decoupling layer bordering on the second electrode or adjacent to it, that a thick doped charge transport layer is present between the light-emitting organic layer and the decoupling layer that constitutes a protection for the light-emitting layer during the production of the decoupling layer.

The additional layer purposefully has as decoupling layer a thickness between 0.05 μm and 1000 μm, especially between 0.5 μm and 100 μm.

It can be purposeful if the additional layer is designed in such a manner that it does not elevate the decoupling efficiency of light but rather also constitutes at the same time a protection for the layers arranged between the electrodes against mechanical load, electromagnetic radiations, particle radiations, moisture, air and/or chemical influences. In this manner the additional layer additionally offers an encapsulation or protective function that is especially advantageous in display applications.

The application of the additional layer onto the second electrode can take place by one or more known techniques. For example, the additional layer can be sputtered on, grown on in a crystalline manner or also be amorphously precipitated. The sole prerequisite is that the additional layer has the previously indicated optical heterogeneities in order to elevate the decoupling efficiency.

It can be purposeful if the additional layer has a matrix, especially a matrix that can be brought into solution for the purpose of applying the additional layer, in which matrix extrinsic, optically effective heterogeneities were introduced. This matrix can comprise, in particular, a photolacquer in which extrinsic, optically effective heterogeneities are embedded. Furthermore, it is, however, also possible to structure, especially roughen the photolacquer on its surface so that the optically effective heterogeneities are arranged on the surface.

It can also be purposeful for various applications if the additional layer has intrinsic, optically effective heterogeneities such as, e.g., spatially separate, different phases or defects. These heterogeneities should be adjusted for making a Mie scattering of light available in as far as they have an expansion in a range between 0.05 μm and 100 μm.

As concerns the method, the invention solves the above task with a method for producing a top-emitting, electroluminescent component designed in particular as an organic light-emitting diode device in which a first electrode nearest to a substrate, a second electrode at a distance from the substrate and at least one light-emitting organic layer located between both electrodes are arranged, which second electrode is transparent for the emitted light. The method is distinguished in that an additional layer with optically effective light-scattering heterogeneities is applied on the side of the second electrode facing away from the at least one organic layer. This additional layer can be designed by one or more of the known technologies for applying thin layers. In particular, the additional layer can be applied wet-chemically onto the second electrode. The additional layer can be formed from a matrix material into which scatter particles with the given particle size are mixed, the mixture being applied with wet chemistry. A solvent can be added to the matrix material for the purpose of processing. The solvent can serve on the one hand for the wet-chemical application of the additive layer or first make possible the mixing of the scatter particles with the matrix material. Furthermore, a dispersing agent can be provided for mixing the particles with a matrix material. It is also within the scope of the invention if the scatter particles are made available in the form of gas bubbles generated by suitable methods in the matrix material.

A method for applying the additional layer that is especially advantageous because it can be carried out in a simple manner consists in laminating or pasting the film on, wherein film is provided with the optically effective heterogeneities in the form of scatter centers.

Furthermore, the additional layer can be sputtered on, grown on or precipitated, e.g., by a PECVD (plasma enhanced chemical vapor deposition) method. In this manner the additional layer can be formed to be crystalline, amorphous or even like glass. In particular, it can be advantageous if the additional layer is vapor-deposited from the gaseous phase, the vapor parameters being adjusted in such a manner that the formation of polycrystalline microstructures and offset structures is promoted that act during operation as optical heterogeneities for increasing the decoupling efficiency of the component.

In order to produce an especially high density of the optically effective heterogeneities it can be provided that different material with different lattice constants are vapor-deposited during the production of the additional layer. As a result thereof, the occurrence of polycrystalline growth and/or offsetting limits in the additional layer are reinforced. The different material can either be vapor-deposited simultaneously or successively so that the additional layer consists of a sequence of thin layers of different materials.

Furthermore, it can also be purposeful if the material of the additional layer is vapor-deposited or sputtered on, during which the material forming the optical heterogeneities is introduced into the additional layer by a cold spray method.

Furthermore, it can also be purposeful if a self-crystallizing or a partially self-crystallizing organic layer is vapor-deposited in order to form the additional layer. The former crystallizes polycrystalline with the optically effective heterogeneities caused by the above, and different phases (crystalline, amorphous) are present in the second layer that produce and represent the described scatter centers. The vapor-depositing of organic layers as additional layer has the advantage that these layers can be readily applied onto the actual OLED structure without destroying it. The refractive index of the decoupling layer does correspond approximately to the actual OLED but is, however, acceptable in the case of the top-emitting component.

As has already been explained above, a transport layer between 100 nm and 1000 nm thick and comprising an organic doping can be applied with advantage so that the additional layer can be subsequently applied wet-chemically onto the upper thin contact layer (transparent electrode), by thermal vapor-deposition or sputtering without the light-emitting organic layer being damaged. It can also be purposeful if the additional layer is sputtered on using an inert gas in order that the organic layers of the component are not damaged by a reaction with the plasma.

It can be purposeful in the production if the material of the additional layer and the material forming the scatter centers are alternately sputtered on or vapor-deposited in order to form the additional layer. Accordingly, the optimal application technique can be used for the particular material. To this extent both materials can be applied with the same technique or with different techniques.

As has also already been explained, the optical heterogeneities can purposefully also be generated on the surface of the additive layer that faces away from the second electrode. For example, methods of brushing, grinding, sandblasting or also microstructuring of the additional layer by photolithographic techniques are suitable for this purpose. In these mechanical methods the process parameters are to be selected in such a manner that the organic light-emitting diode is not damaged. The decoupling layer should purposefully have a sufficient mechanical stability for this. It can possibly be purposeful here to use a bi- or multilayer for the additional layer in order to do justice to these requirements. The indicated methods such as sandblasting, grinding and brushing are methods with whose aid irregular material can be removed from the surface of the decoupling layer, which produces a roughened surface that contributes in the manner described to an improved decoupling of light.

An especially advantageous method is constituted by the application of a surface structure by pressing a microstructured stamp into the outer surface of the additional layer. As a result of the application of the stamp pressure either the material of the decoupling layer is permanently deformed or partially split, which produces a irregularly formed surface that produces the desired effect for elevating the decoupling of light.

In order to avoid that the OLED located under the decoupling layer is damaged during the application of the stamping pressure it can be provided that the forces introduced by the stamping procedure into the additional layer run substantially along the layer. This can be achieved in particular by an appropriate geometric shaping of the stamp.

However, it can also be purposeful if the stamp has a wave form for structuring a surface of the additional layer, which stamp can be produced, e.g., by a photolithographic method.

Furthermore, a photolithographic method or a screen printing method can be used with advantage to produce a structured surface on the additional layer.

A method for applying the additional layer that is especially protective of the OLED consists in at first producing it as a film and subsequently laminating or pasting it onto the component.

DESCRIPTION OF PREFERRED EMBODIMENTS OF THE INVENTION

Figure 2:
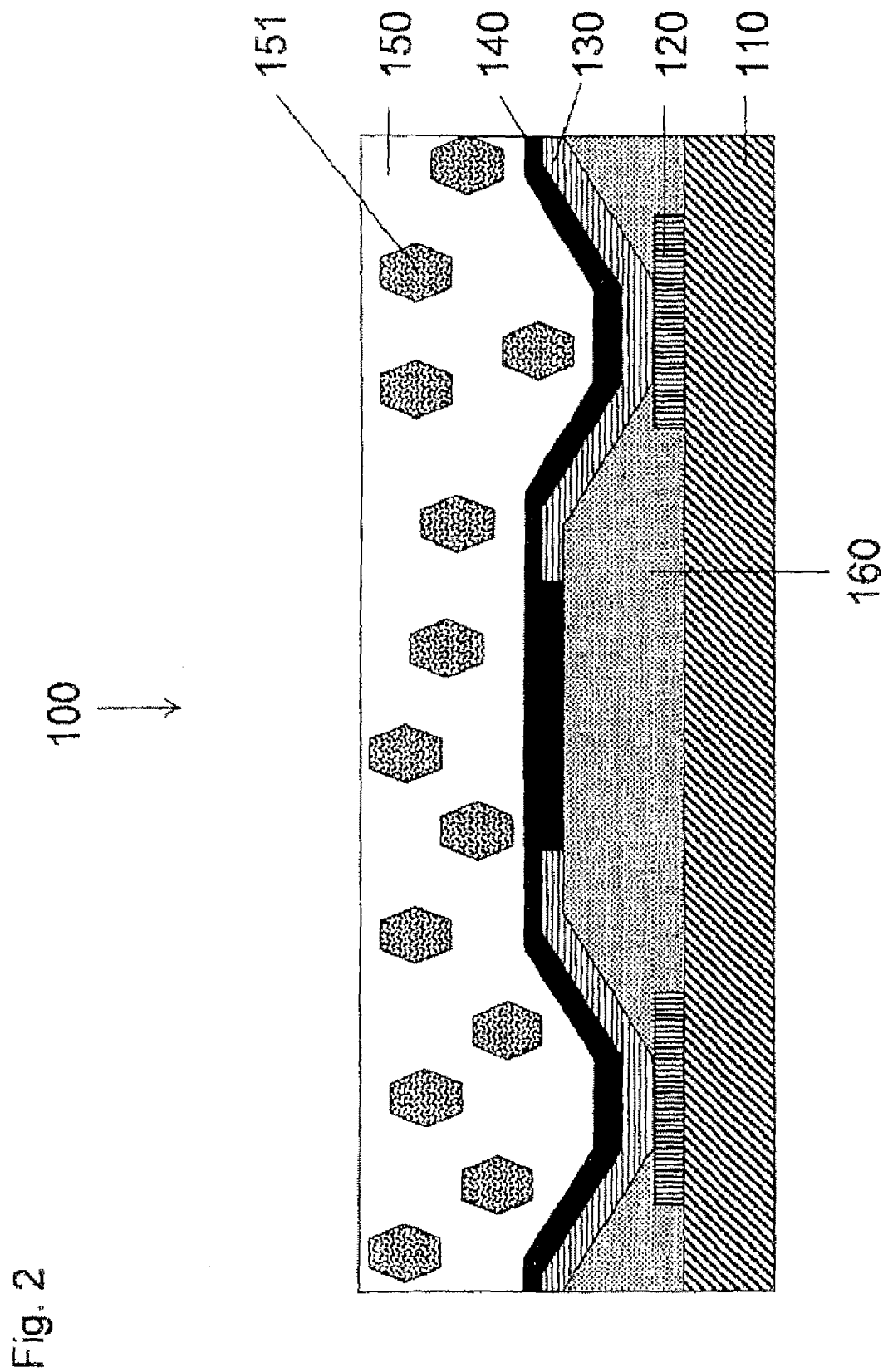
Figure 3:
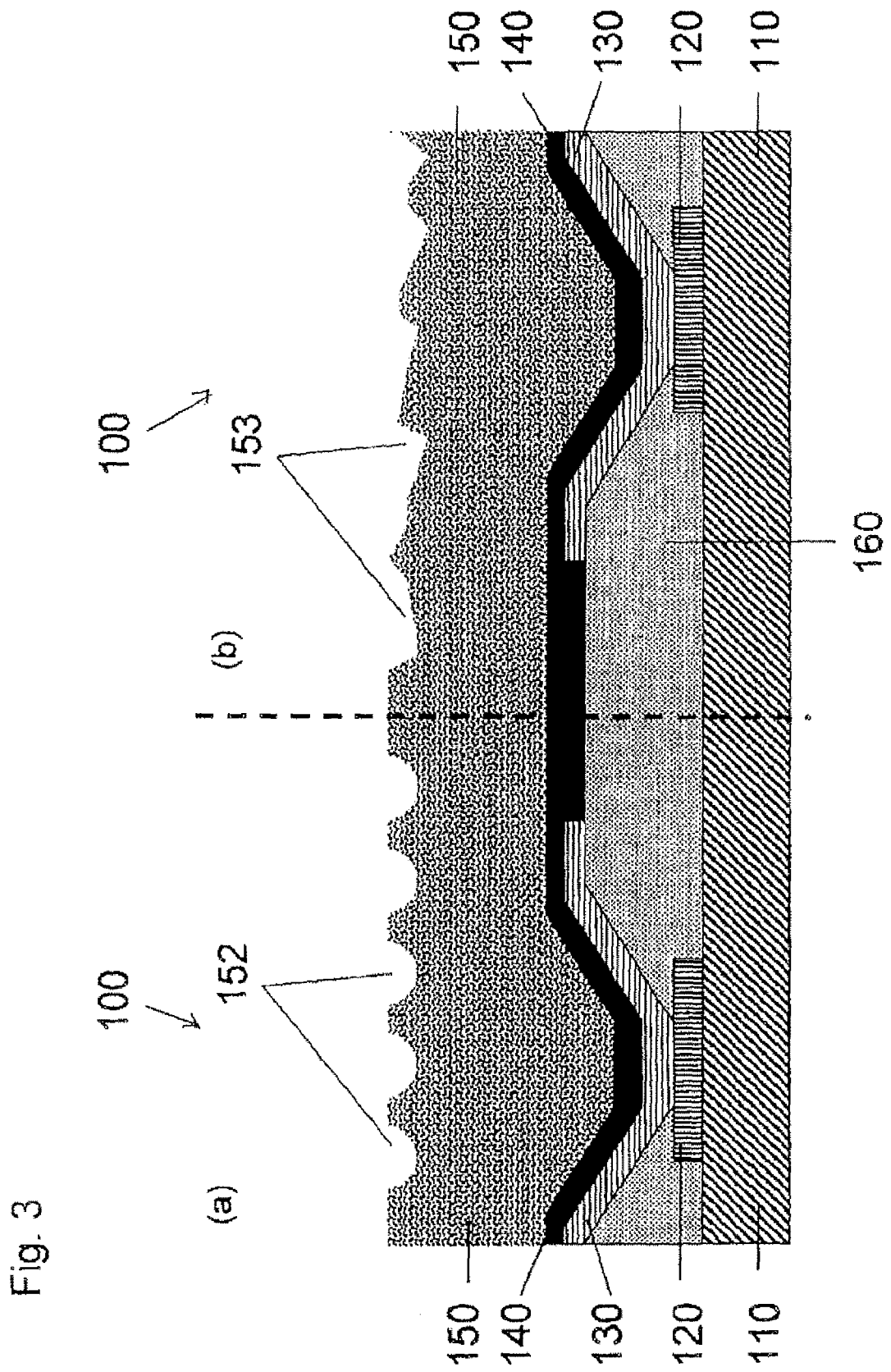
Figure 4:
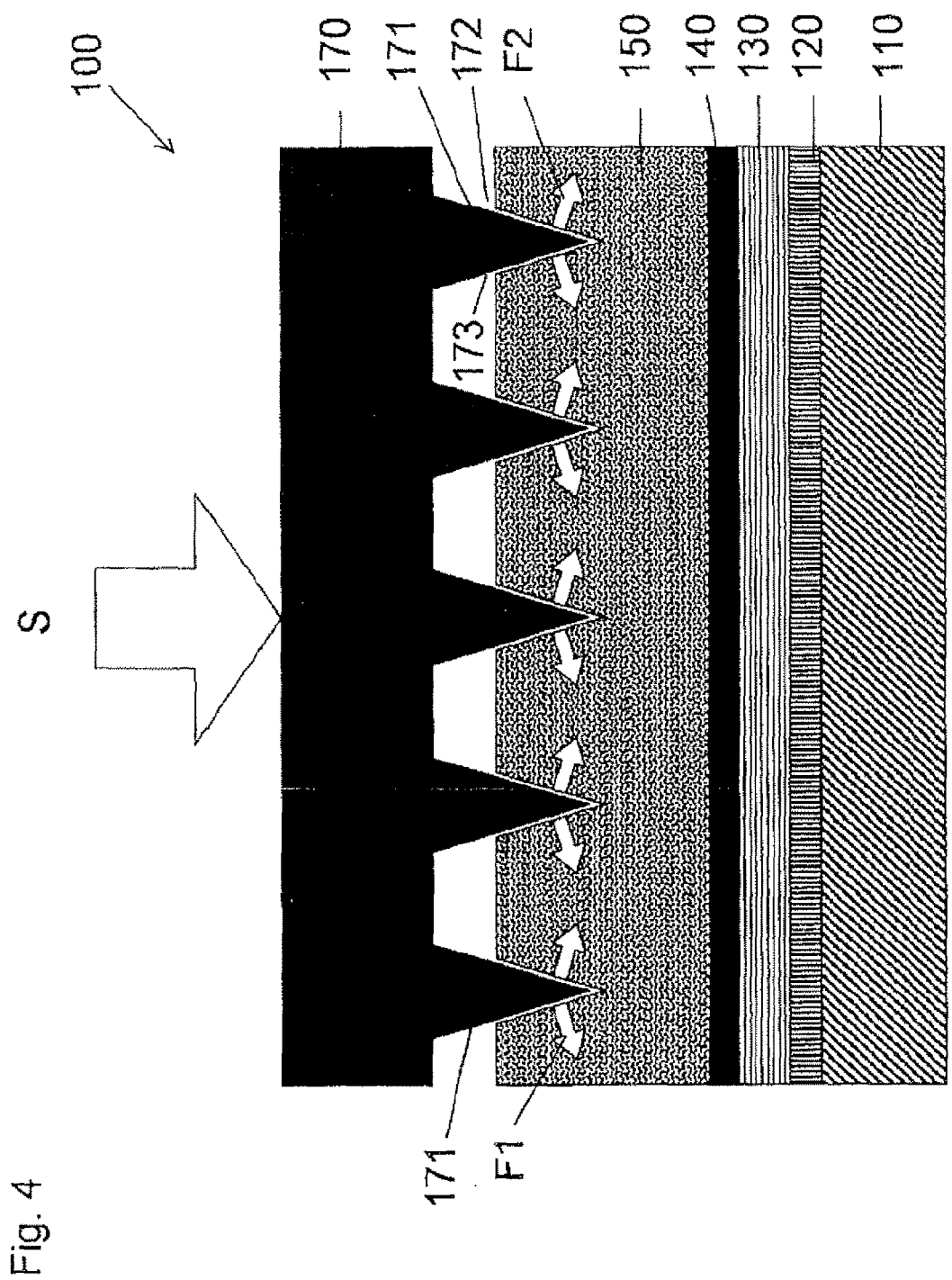
Figure 5:
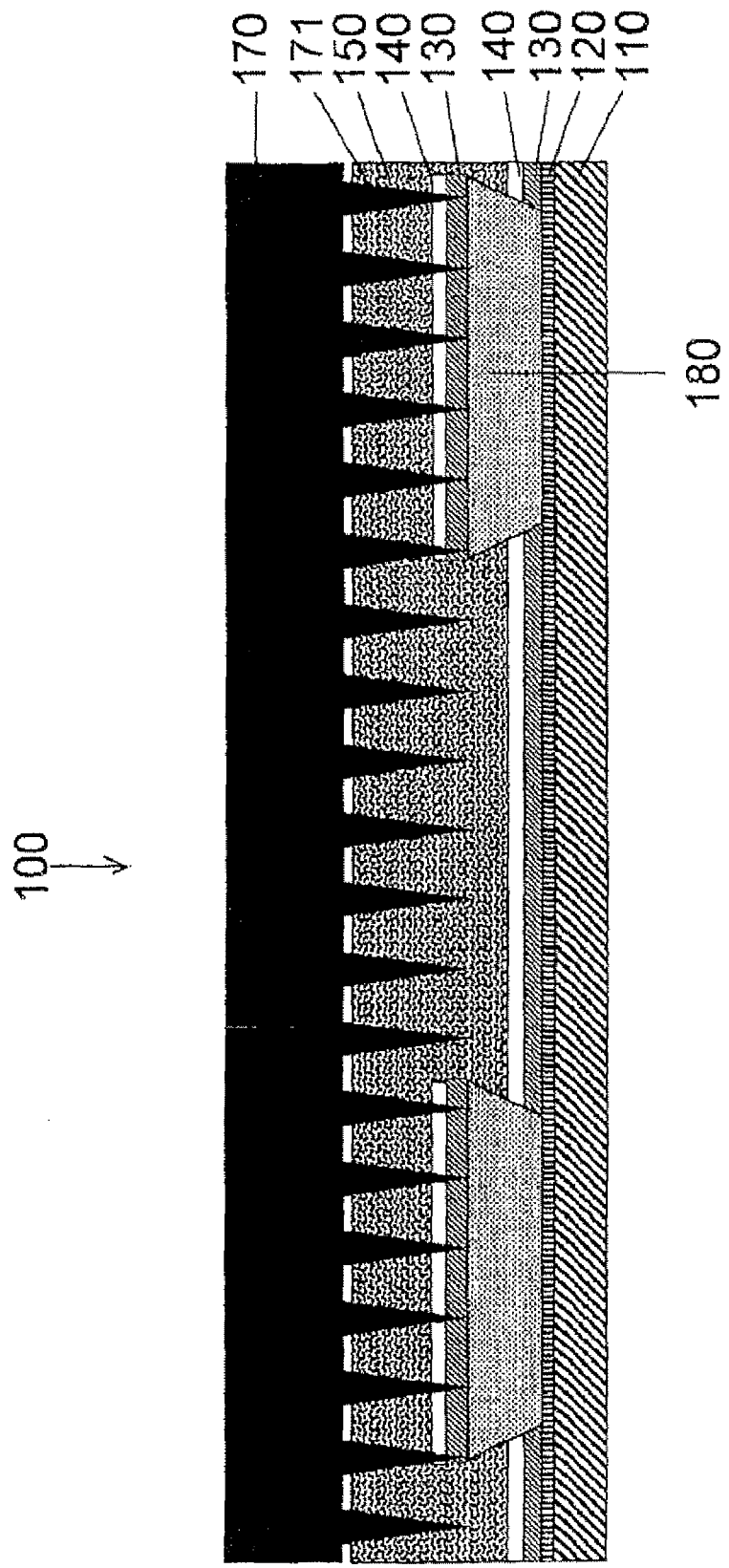
Figure 6:
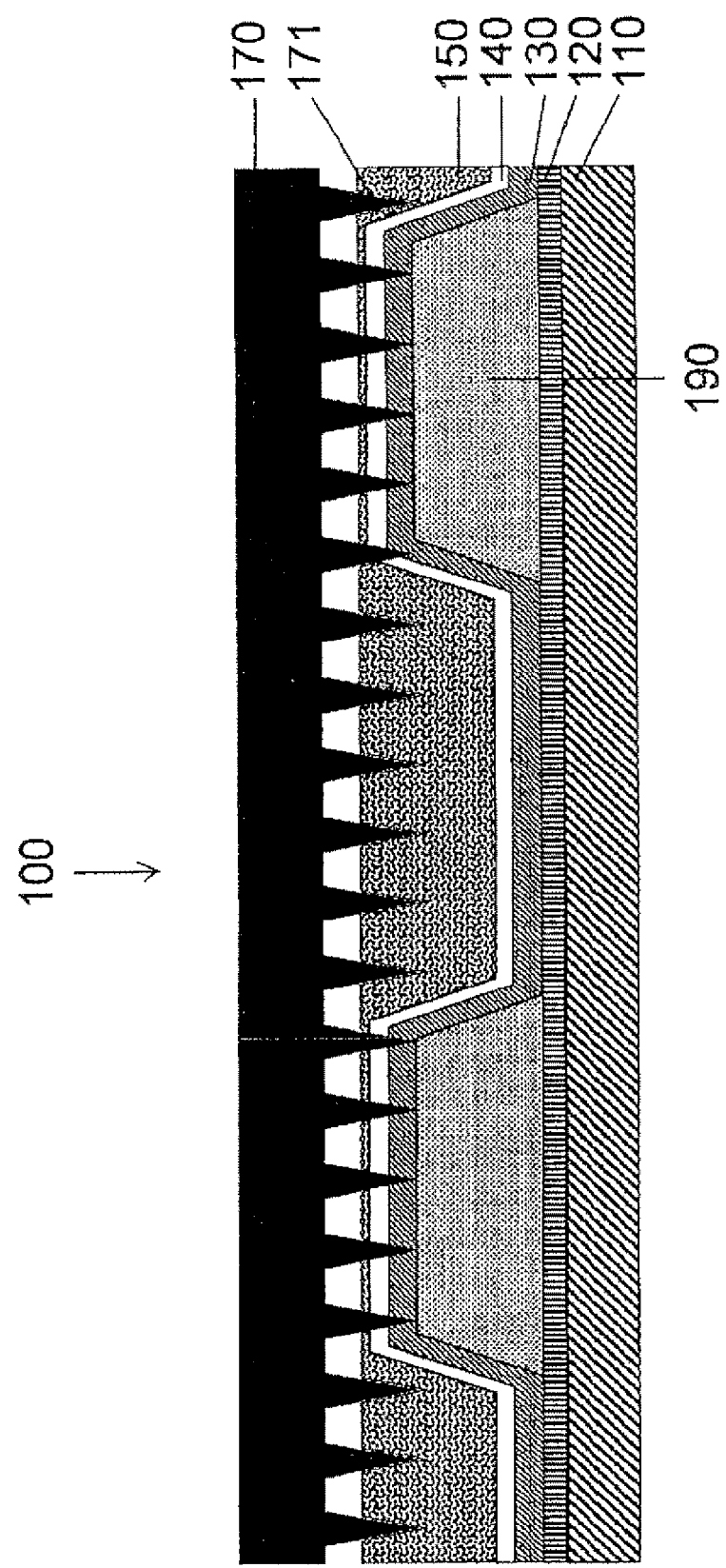

The invention will be explained by describing a plurality of embodiments with reference being made to the enclosed figures, in which FIG. 1 shows a traditional top-emitting OLED in a diagrammatic view, FIG. 2 shows a top-emitting component designed in accordance with the invention according to a first embodiment in a diagrammatic view, FIGS. 3a/b shows a top-emitting component designed in accordance with the invention according to a further embodiment in a diagrammatic view, FIG. 4 shows a method for producing a top-emitting component in accordance with the invention in a diagrammatic view, FIG. 5 shows the diagrammatic method presented in FIG. 4 on a real OLED structure, and FIG. 6 shows the diagrammatic method presented in FIG. 4 on a different OLED structure.

FIG. 1 shows a construction of a traditional top-emitting component 100 in a diagrammatic sketch. In the indicated example electrode 120 nearest to substrate 110, which is designated in the following as the first electrode, is designed as a reflecting metallic layer. Several organic layers are applied onto the first electrode that is indicated in the figure as organic layer structure 130. This layer structure comprises at least one organic electroluminescent layer. Layer structure 130 is followed by a second electrode 140 consisting of a transparent material, e.g., a conductive oxide.

When a voltage is applied between the two electrodes, charge carriers, that is, electrons from the one side and holes from the other side are injected from the contacts into the intervening organic layers, whereupon electron-hole pairs form in the active zone that recombine under the emission of light. In the figure an exemplary emission point is designated with number 131. The light propagates starting from this emission site, which is indicated in the figure with individual arrows. As can be recognized, a reflection of the light and/or a transmission into the next layer takes place at the boundary surfaces between two layers. The light that remains within the component, here within layer structure 130 and/or electrode 140 (beam OM1), is designated as organic mode, and the light that leaves the component (beams EM1, EM2) is designated as external modes. Since even the organic layers have a coefficient of absorption that is not equal to 0 for the light produced within the layers, this light is absorbed in the course of the propagation in the direction longitudinal to the layer.

The invention begins here now with such a design of the OLED that the decoupling efficiency is elevated in a top-emitting component. To this end an additional layer that is also designated as a decoupling layer is provided in accordance with the invention on the side of the second electrode that has optically effective heterogeneities as scatter centers, said heterogeneities being arranged as a function of the embodiment either within the decoupling layer or on its surface. A first exemplary embodiment for the first configuration is shown in a diagrammatic sketch in FIG. 2. Since the number of organic layers plays a subordinate part for the present invention they are also indicated in FIG. 2 only as layer structure 130. An electrode 120 is applied onto substrate 110 designed as a backplane and associated with it, which electrode 120 is followed by organic layer structure 130 in which the light is produced, as a rule in the visible range. This is customarily followed by second electrode 140 onto which an additional layer, decoupling layer 150 is applied in accordance with the invention. The latter comprises scatter particles 151 in its volume that have a particle size between 50 nm and 100 μm. In the example shown the particle size in all scatter centers is in a range of approximately 20 nm.

The component in accordance with the invention shown in FIG. 2 can be produced in various ways depending on the embodiment. Depending on the embodiment the decoupling layer is applied wet-chemically by a printing method (inkjet printing, screen printing, flexo printing, tampon printing and other high-pressure, variable-depth photogravure planographic and porous printing methods), doctoring, spincoating, dip-coating roll-coating, spraying, etc. The decoupling layer obtained either displays qualities scattering in the indicated magnitude without further additives solely by intrinsic heterogeneities within the layer or they are produced by added particles that differ in their optical qualities from the actual layer. In this case the scatter particles can be dispersed, e.g., into the solution.

Depending on the embodiment one or several of the following materials are used for the additional layer that that are present, depending on the application method used, during the processing as solution, emulsion and/or dispersion and form the matrix of the decoupling layer after the application onto the OLED, e.g., by evaporation of the solvent (hardening):

Polymeric solutions such as, e.g., solutions of polyfluorenes or polystyrenes in organic liquids, e.g., aromatic solvents such as xylene, toluene, anisole, trimethylbenzene, and others, Solutions of organic non-polymeric layer-forming material such as solutions of organic glasses, e.g., orthoterphenyl or 1,3,5-tri-alpha naphthyl benzene in aromatic solvents, e.g., xylene, A monomer or a mixture of monomers that that polymerize after the application as methylmethacrylates or alkyldiglycolcarbonate or derivatives thereof that are polymerized after the application in a thermal, chemical or photo-initiated manner, A monomer or a mixture of monomers that are linked after the application by polyaddition, e.g., polycarbonates, Optical adhesives, Photolacquers, Transparent or semi-light-permeable adhesives such as chemically hardening adhesives (e.g., 2-component adhesives), thermally hardening adhesives (e.g., acrylates, epoxy resins) or UV-hardening adhesive such as acrylates or epoxy resins, Transparent thermoplastics such as low-density polyethylene, polycarbonates and polyurethanes, Duroplastics such as phenol resins or melamine resins, Emulsions such as aqueous or organic or fluoro-organic emulsions of, e.g., polyacrylate, polyvinyl alcohol or polyvinyl acetate, Clear lacquers such as alkyd resin lacquers, nitro and nitro combination lacquers, two-component lacquers such as polyurethane lacquers, water-dilutable lacquers, artificial resin lacquers and acrylate lacquers, Collagen proteins such as gelatins, cellophane or celluloid, Dispersions such as polymeric dispersions (e.g., titanium dioxide particles and polyvinyl acetate in water) and Solutions or dispersions of inorganic materials such as saline solutions.

Depending on the matrix material used the scatter particles are selected from a group of a plurality of possibilities, e.g.:

Inorganic microcrystals such as saline crystals or metallic oxides such as silicates, sapphire microcrystals, MgO or $SiO_2$, Organic microcrystals such as carbohydrates, crystallized polymer particles such as starch, cellulose or synthetic polymers such as polyimides, poly-3,4-ethylene dioxythiophene (PEDOT): poly-(styrene sulfonates) (PSS) crystals, Aerosils, Inorganic amorphous materials, e.g., quartz glass ($SiO_2$), Nanoparticles, Powder from polymers such as polycarbonates, polyacrylates, polyimides, polyester, polyethylene (PE), polypropylene (PP), polyether, fluoropolymers, polyamides and polyvinyl acetates, Powder from non-polymeric organic materials such as aromatics, aliphatics and heterocyclics, Gas bubbles introduced, e.g., by foaming with gases such as inert hydrocarbons (pentane), noble gases (argon), $N_2$, $CO_2$ or FCHC of the matrix solution.

Gas bubbles introduced chemically by, e.g., the course of a chemical reaction in the matrix solution in which a gaseous reaction product such as $CO_2$ or $N_2$ is produced.

Furthermore, the additional layer can be applied in a dry manner by lamination in an embodiment that is not shown. In it the described heterogeneities are introduced already during the production of the film to be laminated wherein, e.g., all cited matrix agents in combination with the scatter particles that were also indicated above are suitable that can be laminated. For example, aerosil particles are embedded in a film of polyvinyl acetate, the film being laminated onto the top-emitting OLED. Alternatively, the film can also be pasted on. The pasting of the additional layer constructed as a film can be carried out in particular with the aid of a double-sided pasting film in which the one side of the pasting film is brought in contact with the additional layer film and the other side of the pasting film is brought in contact with the component, in particular with an electrode.

Another class of top-emitting electroluminescent components in accordance with the invention is produced in that the additional layer is supplied by one of the methods of sputtering, PVD (physical vapor deposition), CVD (chemical vapor deposition), PECVD (plasma enhanced chemical vapor deposition), MBE(molecular beam epitaxy), MEE (molecular enhanced epitaxy), MOVPE (metal organic vapor pressure epitaxy) or OVPD (organic vapor phase deposition). The following materials are used when using these methods that are also only cited by way of example:

- Metal oxides such as, e.g., silicon oxide ($SiO_2$), zinc oxide (ZnO), zirconium oxide ($ZrO_2$), aluminum oxide ($Al_2O_3$), indium-tin oxide (ITO) or indium-zinc oxide (IZO), titanium oxide ($TiO_2$), gallium oxide ($Ga_2O_3$),
- Binary semiconductor compounds with a large band gap such as, e.g., II-VI and group III-nitride compounds as well as their compound semiconductors,
- Organic layers such as, e.g., monomers that are vapor deposited and subsequently polymerized such as methyl methacrylate (MMA), acrylic acid,
- Organic layers of small molecules such as aromatics, aliphatics, heterocyclics, ketones such as e.g., tetrakis-diphenylaminospirobifluorene (spiro-TAD), triscara-zolyltriphenylamine (TCTA), bathophenanthroline (Bphen).

Most of these materials cited for the additional layer are distinguished in addition to their transparency in the visible spectral range by a refractive index that is greater than or equal to or that of the organic layers. To this extent the light generated in the active organic layer is coupled especially effectively from the organic layers into the additional layer of the component in accordance with the invention and decoupled from there out of the structure by the indicated scatter centers. Since most of these materials of the additional layer are transparent in the visible spectral range but highly absorb in the UV range, such additional layers not only offer protection against moisture and air to the organic layers but also against UV radiation.

The organic layers of the component can be damaged either by reaction with the plasma or also mechanically, especially during the sputtering of metal oxides, e.g., for applying the transparent electrode in the form of ITO or when applying $SiO_2$ in the case of the additional layer. For this reason a non-reactive gas such as argon is used when using such a production method for the additional layer and furthermore the uppermost organic layer of the diode for protecting the light-emitting layer is constructed to be especially thick as a rule. In order to avoid that the voltage drop via this uppermost organic layer of the diode is too high, according to unexamined publication (Offenlegungsschrift) DE 102 15 210 A1, whose disclosed content is completely included here by reference, the conductivity of this layer can be increased by doping. For example, the transport layer has a thickness between 100 nm and 1 µm, depending on the embodiment, so that the active organic layer below the transport layer is protected in the following process steps, especially in the sputtering on of the transparent decoupling and/or the sputtering on of the additional layer.

In a further embodiment of the invention the material of the additional layer such as, e.g., ZnSe or GaN is precipitated from the gaseous phase, as a result of which the organic layers of the diode are loaded much less since no gas plasma is required in this production method. The particular material of the additional layer is applied onto the transparent electrode by thermal evaporation in a vacuum. Typical evaporation temperatures are, e.g., for ZnSe approximately 600° C. to 800° C. During the vapor deposition process the component is located at a sufficient distance from the heating source so that there is no danger of heat radiation for the organic layers of the layer structure. Once more, the influence of heat on the OLED can be minimized by thick, doped transport layers.

The inclusion of the scatter centers into the layer takes place automatically during the vapor deposition from the gaseous phase on account of the prevailing growth conditions for the additional layer. Since the component surface is not sufficiently smooth and has a temperature of RT, no monocrystalline, smooth film can grow on; however, for thermodynamic reasons there is also no completely amorphous layer growth. The growth conditions result in a lumping out of polycrystalline microstructures on produced growth nuclei that coalesce over time to a closed layer. This produces offsetting limits of the individual microcrystalline areas as a result of which the desired optical heterogeneities are formed in the form of scatter centers. These offsetting limits are especially pronounced in the direction of growth and result in the desired scatter of the light coupled into the additional layer. The separation of the additional layer or decoupling layer into individual microcrystalline domains can be strengthened even more in that alternately different II-VI materials such as, e.g., ZnSe and CdS or group III nitrides such as GaN and AlN are vapor deposited. The latter preferably clump out on account of their different lattice structure in separate crystal domains and additionally have different refractive indices so that as a result especially effective optical heterogeneities are formed.

In the embodiments in which the decoupling layer is formed by the sputtering of metal oxides a completely amorphous film is produced. In one embodiment the scatter particles are achieved in the additional layer by alternately sputtering the material of the additional layer and applying micrometallic particles with the aid of cold spray methods. In such a cold spray method a metallic powder, e.g., copper powder, is introduced as scatter centers with micrometer size into the decoupling layer. In another embodiment the additional layer with optical heterogeneities contained in it is produced in that the additional layer material and a metal such as, e.g., copper are alternately sputtered onto the component. The metal is sputtered only very briefly in order that only metallic clusters are produced but no continuous metallic film that would absorb too strongly.

In embodiments in which organic layers are vapor deposited in order to shape the decoupling layer there is also the possibility of introducing the scatter centers by sputtering or cold spray methods so that micrometallic particles or metal oxide clusters are present as heterogeneities in the additional layer. In another embodiment clusters of semiconductor compounds are vapor deposited between the organic layers. In yet another embodiment of the component in accordance with the invention organic materials that self-crystallize polycrystalline are selected for producing scatter centers in the decoupling layer. Depending on the embodiment in such a component the additional layer is formed, e.g., by anthracene, phthalocyanine, terphenyl diamine (TPD), perylene tercarboxylic dianhydride (PTCDA) or Bphen.

Moreover, there are also embodiments of the invention in which the additional layer is produced by the vapor deposition of organic layers and subsequent polymerization, e.g., by UV irradiation. Additional scatter centers in the form of micrometallic particles or metal oxide clusters can again be introduced via a cold spray method or a metal sputtering into the decoupling layer. An additional layer of methyl methacrylate (MMA) is indicated as an exemplary embodiment, which methyl methacrylate is polymerized after the introduction of the scatter particles by irradiation with UV light to Plexiglas (PMMA). This subsequent polymerization of the layer has the advantage that the additional layer is not damaged by the introduction of the scatter particles.

The previously described embodiments of the component in accordance with the invention are limited to OLEDs with an additional decoupling layer on the second electrode and in which optical heterogeneities are arranged within the additional layer.

Furthermore, it is also possible in other components to arrange these heterogeneities on the surface of the additional layer, said heterogeneities having a size between 50 nm and 100 μm. In this type basically all the above-named matrix agents, all above-named materials for producing lamination films as well as all above-named materials for sputtering on, precipitation and vapor deposition as well as combinations of all these materials can be used as material for the additional layer. The structuring of the surface of the additional layer takes place in accordance with the embodiment by a mechanical or non-mechanical method. Mechanical methods for producing the component in accordance with the invention for structuring the surface of the decoupling layer are, e.g.:

Stamping with a microstructured stamp
Sandblasting an additional layer of an organic glass
Brushing
Grinding FIGS. 3a/b) shows embodiments of a top-emitting, electroluminescent component in accordance with the invention with a decoupling layer whose surface facing away from the second electrode is structured. The design of the substrate 110, the first electrode 120, the organic layer structure 130, and the second electrode 140 is identical to that of the example shown in FIG. 2. The structuring of the surface is made available in the case of the embodiment shown in FIG. 3a in a side view by a uniform line-up of symmetric furrows or grooves 152 on the surface of decoupling layer 150. This structuring is produced in the embodiment shown in FIG. 3a by brushing the additional layer in a direction vertical to the plane of the drawing. In one embodiment (not shown) the structuring of the surface can also be carried out in the form of pits or depressions, wherein the structuring can be shaped to be one-dimensional, that is linear, as well as also two-dimensional.

In contrast thereto, the embodiment shown in FIG. 3b has a structuring of the surface of additional layer 150 that is not uniform but rather has randomly distributed and formed broken-out areas or recesses 153 that were produced by a grinding method.

FIG. 4 shows a diagrammatic sketch of the structuring of the additional layer 150 by a stamp 170 comprising a plurality of evenly spaced cutting edges 171 formed by two surfaces 172, 173 tapering to a point. In a first step of the method, the additional layer 150 is applied onto the second electrode 140 and subsequently structured on its surface with the method step shown in FIG. 4. To this end the described stamp 170 is placed on the surface of the additional layer 150 and pressed into it with a given stamping force S. The indicated design of cutting edges 171 produces a force course in additional layer 150 like the one indicated by arrows F1, F2. As is apparent from the figure, a large part of the exerted stamping force is deflected laterally within decoupling layer 150 by the indicated design of the stamp so that the organic layers 130 located beneath it are not loaded. After the stamp is removed the surface of the decoupling layer 150 is structured by a plurality of evenly spaced grooves since the splitting of the additional layer on its surface is irreversible. These grooves and their limiting surfaces accordingly form optically active heterogeneities.

In another embodiment of the invention shown in FIG. 5 additional separators 180 (e.g., of photolacquer or $SiO_2$) are integrated into the component, which separators prevent stamp 170 serving as a shaping tool from causing deformations or damage in the organic layer structure. Such structures for cathode separation or pixel definition are provided anyway in particular in active or passive matrix displays. These separators 180 present in the displays are only designed in the present invention for being used in such a manner that they resist the shaping operation with shaping tool 170 as regards dimension and stability.

FIG. 6 shows a similar embodiment of the invention that shows a component in accordance with the invention for illumination applications in which spacers 190 are introduced in order to avoid damage to organic layer structure 130. Again, the spacers must be designed in particular mechanically in such a manner that they resist the mechanical loading during the stamping operation for producing the optically active heterogeneities in the outer surface of the additional layer.

The stamping of wet-chemically produced decoupling layers takes place before, during or after the hardening of the layer, depending on the embodiment. In the first-cited instance, the mechanical loading is the least for the organic layer structure.

An especially protective method when structuring the additional layer is carried out with a technique modeled after the screen printing method. In it one of the above-indicated, wet-chemically produced layers is first applied onto the second electrode of the component and is structured by placing and pressing a fabric on it. Doctor blades customary in a screen printing method are used, among other things, to press the fabric on, e.g., using polyurethane doctor blades. In a further embodiment a further layer is doctored on wet-chemically via the fabric, which brings about an etching of the layer located underneath it and thus facilitates the structuring. Care is to be taken in every case that the deformation remains permanently even after the hardening of the decoupling layer.

As has already been explained, the roughening of the decoupling layer takes place in a non-mechanical manner in other embodiments. These methods are especially applicable when the decoupling layer is very thin or very soft so that no sufficient mechanical protection can be made available for the organic layers located underneath it. Possible deformation methods of the surface of the additional layer are:

Reactive dry etching
Non-reactive dry etching
Wet-chemical etching, e.g., with acids
Photolithographic structuring The roughening of the decoupling layer takes place before it is applied onto the component, in particular in the case of an extremely sensitive organic layer structure. This can distinctly reduce the mechanical, thermal, radiant and/or chemical load of the component. This advantageous method is achieved, e.g., by laminating on a pre-structured lamination film. At first, a transparent or semitransparent lamination film of one of the above-indicated solvent materials is processed. It is subsequently structured with one of the above-indicated mechanical or non-mechanical methods on its surface in such a manner that its front side is roughened, which prevents or reduces the total reflection in the film and therewith the formation of organic/electrode modes in the component. The laminating of the film onto the component takes place in such a manner that the smooth back side is connected to the component, as a rule to the second electrode.

In such an exemplary component in accordance with the invention the lamination film consists of polyvinyl acetate that is roughened by grinding and is then laminated or pasted with its smooth side onto the transparent electrode, that is, the top electrode. The efficiency is elevated up to 300% with a component produced in this manner.

In an embodiment that is particularly advantageous but not shown the additional layer is adhered in the form of a pre-structured foil by an adhesive on its smooth side onto the transparent top electrode of the component. The adhesive is highly transparent and its qualities are selected in such a manner that it encapsulates the organic layers well. This makes available a sufficiently good protection against environmental influences and furthermore in this manner an additional encapsulation of the OLED can be dispensed with. The structuring of the film can have different forms depending on the embodiment and a structuring of the film designed with roof-shaped strips and a height between 1 µm and 100 µm is especially advantageous. Furthermore, the structuring can also be areal, e.g., by means of pyramidal structures.

In a further especially advantageous embodiment the decoupling layer is vapor deposited onto the transparent top electrode as an organic layer of Bphen. The scatter centers in the decoupling layer are formed in that Bphen is partially self-crystallizing. In order to protect the organic layers from environmental influences an additional encapsulation is provided with a thin glass disk. In order to avoid that this glass disk influences the decoupling of light, the encapsulation glass disk is attached at a sufficient distance to the decoupling layer that the glass disk acts only as a plane-parallel plate.

The invention claimed is:

1. A top-emitting, electroluminescent component comprising a substrate, a first electrode nearest to the substrate, a second electrode at a distance from the substrate, at least one light-emitting organic layer arranged between the two electrodes, wherein emitted light is transmitted through the second electrode, and an additional layer arranged on the side of the second electrode that faces away from the at least one light-emitting organic layer, wherein the additional layer comprises optically effective light-scattering heterogeneities and is an organic layer consisting essentially of at least one small molecule, wherein the degree of transmission of the additional layer at the wavelength of the emitted light is greater than 0.6, wherein the optically effective light-scattering heterogeneities comprise intrinsic heterogeneities in the additional layer and are arranged within and on the surface of the additional layer.

2. The component according to claim 1, wherein the additional layer is adjacent to the second electrode and is connected to it.

3. The component according to claim 1, wherein the additional layer is spaced apart from the second electrode, the distance being less than 500 mm.

4. The component according to claim 1, wherein the heterogeneities have a size of about 0.05 µm to about 100 µm.

5. The component according to claim 1, wherein the thickness of the second electrode is less than 200 nm, and the refractive index of the additional layer is greater than the refractive index of the nearest organic layer arranged between the electrodes.

6. The component according to claim 1, wherein the refractive index of the additional layer is greater than the refractive index of the second electrode.

7. The component according to claim 1, wherein the refractive index of the additional layer is between about 1.3 and about 2.3.

8. The component according to claim 1, wherein the organic layer nearest to the additional layer and arranged between the electrodes is a hole transport layer, which is p-doped with an acceptor-like organic material and has a thickness of between about 50 nm and about 2 µm.

9. The component according to claim 1, wherein the organic layer nearest to the additional layer and arranged between the electrodes is an electron transport layer, which is n-doped with a donor-type organic material and has a thickness of between about 50 nm and about 2 µm.

10. The component according to claim 1, wherein the additional layer has a thickness of between about 50 nm and about 1000 µm.

11. The component according to claim 1, wherein the additional layer provides protection for the layers arranged between the electrodes against mechanical loads, electromagnetic radiation, and particle radiation.

12. The component according to claim 1, wherein the additional layer is sputtered on the second electrode, grown on, precipitated or applied by a PECVD (plasma enhanced chemical vapor deposition) method.

13. The component according to claim 1, wherein the additional layer is wet-chemically processed, laminated or pasted on.

14. The component according to claim 1, wherein the additional layer comprises several spatially separated sub-layers with different refractive indices.

15. The component according to claim 1, wherein the additional layer is vapor deposited from the gaseous phase, sputtered on, or applied by a PECVD (plasma enhanced chemical vapor deposition) method, the process parameters being selected so that the formation of polycrystalline microstructures and offset structures is promoted.

16. The component according to claim 1, wherein the additional layer is a self-recrystallized or a partially recrystallized organic layer.

17. The component of claim 1, wherein the component is an organic light-emitting diode device.

18. The component of claim 1, wherein the additional layer comprises at least one metal oxide.

19. The component of claim 18, wherein the at least one metal oxide is selected from silicon oxide ($SiO_2$), zinc oxide (ZnO), zirconium oxide ($ZrO_2$), aluminum oxide ($Al_2O_3$), indium-tin oxide (ITO), indium-zinc oxide (IZO), titanium oxide ($TiO_2$), or gallium oxide ($Ga_2O_3$).

20. The component of claim 1, wherein the additional layer comprises binary semiconductor compounds.

21. The component of claim 20, wherein the binary semiconductor compounds comprise a large band gap.

22. The component of claim 21, wherein the binary semiconductor compounds are selected from II-VI and group III-nitride compounds and their compound semiconductors.

23. The component of claim 1, wherein the at least one small molecule comprises an aromatic compound, a heterocyclic compound, a ketone, or any combination thereof.

24. The component of claim 23, wherein the small molecule is selected from tetrakisdiphenylaminospirobifluorene (spiro-TAD), triscarazolyltriphenylamine (TCTA), bathophenanthroline (Bphen), or any combination thereof.

25. A method of manufacturing a top-emitting, electroluminescent component, in which a first electrode nearest to a substrate, a second electrode at a distance from the substrate and at least one light-emitting organic layer lying between the electrodes are formed, the emitted light being led through the second electrode and an additional layer, wherein the additional layer comprises optically effective light-scattering heterogeneities and is an organic layer consisting essentially of at least one small molecule, being applied on the side of the second electrode that faces away from the at least one light-emitting organic layer, wherein the optically effective light-scattering heterogeneities are formed as intrinsic heterogeneities in the additional layer, and are arranged within and on the surface of the additional layer.

26. The method according to claim 25, wherein the additional layer is wet-chemically applied to the second electrode.

27. The method according to claim 25, wherein the additional layer is sputtered on, grown on, precipitated or applied by a PECVD (plasma enhanced chemical vapor deposition) method.

28. The method according to claim 25, wherein the additional layer is vapor deposited from the gaseous phase, sputtered on, or applied by a PECVD (plasma enhanced chemical vapor deposition) method, the process parameters being selected so that the formation of polycrystalline microstructures and offset structures is promoted.

29. The method according to claim 28, wherein the occurrence of polycrystalline growth and/or offsetting limits in the additional layer is intensified by various materials with different lattice constants that are vapor deposited, sputtered on or applied by a PECVD method.

30. The method according to claim 25, wherein the additional layer is formed by vapor depositing at least one self-recrystallising or one partially self-recrystallising organic layer.

31. The method according to claim 25, wherein between the at least one light-emitting organic layer and the second electrode, a transport layer exhibiting organic-doping and having a thickness between about 100 nm and about 1000 nm is applied.

32. The method according to claim 25, wherein the additional layer is sputtered on using an inert gas or is applied by way of a PECVD method.

33. A top-emitting, electroluminescent component comprising a substrate, a first electrode nearest to the substrate, a second electrode at a distance from the substrate, at least one light-emitting organic layer arranged between the two electrodes, wherein emitted light is transmitted through the second electrode, and an additional layer arranged on the side of the second electrode that faces away from the at least one light-emitting organic layer, wherein the additional layer comprises optically effective light-scattering heterogeneities and is an organic layer consisting essentially of at least one small molecule that is capable of being vapor deposited wherein the degree of transmission of the additional layer at the wavelength of the emitted light is greater than 0.6, wherein the optically effective light-scattering heterogeneities comprise intrinsic heterogeneities in the additional layer and are arranged within and on the surface of the additional layer.

* * * * *